US007034641B1

(12) United States Patent
Clarke et al.

(10) Patent No.: US 7,034,641 B1
(45) Date of Patent: Apr. 25, 2006

(54) SUBSTRATE STRUCTURE FOR PHOTONIC ASSEMBLIES AND THE LIKE HAVING A LOW-THERMAL-CONDUCTIVITY DIELECTRIC LAYER ON A HIGH-THERMAL-CONDUCTIVITY SUBSTRATE BODY

(75) Inventors: Robert A. Clarke, Thousand Oaks, CA (US); Frans Kusnadi, San Jose, CA (US); Richard D. Bjorn, Milpitas, CA (US); John Cameron Major, San Jose, CA (US); Zequin Mei, Fremont, CA (US); Vadim Chuyanov, San Jose, CA (US)

(73) Assignee: K2 Optronics, Inc., Sunnyvale, CA (US)

( * ) Notice: Subject to any disclaimer, the term of this patent is extended or adjusted under 35 U.S.C. 154(b) by 0 days.

(21) Appl. No.: 10/306,636

(22) Filed: Nov. 27, 2002

(51) Int. Cl.
*H01P 1/00* (2006.01)

(52) U.S. Cl. ................ 333/247; 372/43.01; 372/46.01; 372/50.1

(58) Field of Classification Search .................. 372/34, 372/43–50, 36, 50.1; 438/22, 27, 29, 46, 438/65–67, 47; 257/79–100, 431–466; 333/247, 333/238, 246
See application file for complete search history.

(56) References Cited

U.S. PATENT DOCUMENTS

| | | | | |
|---|---|---|---|---|
| 5,577,021 | A * | 11/1996 | Nakatani et al. | 369/275.2 |
| 5,773,875 | A * | 6/1998 | Chan | 257/661 |
| 5,780,314 | A * | 7/1998 | Chan | 438/2 |
| 5,960,014 | A * | 9/1999 | Li et al. | 372/20 |
| 6,174,614 | B1 * | 1/2001 | Yushio et al. | 428/698 |
| 6,271,579 | B1 * | 8/2001 | Going et al. | 257/664 |
| 6,477,302 | B1 * | 11/2002 | Tatoh | 385/49 |
| 6,627,992 | B1 * | 9/2003 | Ammar | 257/728 |

* cited by examiner

*Primary Examiner*—Minsun Harvey
*Assistant Examiner*—Delma R. Flores-Ruiz
(74) *Attorney, Agent, or Firm*—Townsend and Townsend and Crew LLP

(57) ABSTRACT

A substrate structure useful for photonics modules comprises a high-thermal-conductivity (e.g., greater than 20 W/m°K) substrate body with a low-thermal-conductivity (e.g., less than 5 W/m°K) dielectric layer overlying at least a portion of the substrate body. Patterned metal layers for electrical circuit connections can be located on the dielectric layer, on the substrate body (under the dielectric layer, on regions of exposed substrate body, or both), or on both. Where the laser is driven at high frequencies (e.g., 2.5 Gbits/sec), the dielectric layer material and thickness can be chosen to provide desired RF behavior. For example, the electrodes and dielectric layer can be configured to provide a transmission line with the desired impedance. Further, where it is desired to solder a component to the substrate, a heater resistor can be formed on the dielectric layer, thereby facilitating soldering the component.

37 Claims, 2 Drawing Sheets

SUBSTRATE STRUCTURE FOR PHOTONIC ASSEMBLIES AND THE LIKE HAVING A LOW-THERMAL-CONDUCTIVITY DIELECTRIC LAYER ON A HIGH-THERMAL-CONDUCTIVITY SUBSTRATE BODY

BACKGROUND OF THE INVENTION

This application relates generally to high-frequency and broadband device and module structures (e.g., modules for photonics and telecommunications applications), and more specifically to substrate structures that support the components during operation.

There is typically a trade-off between the performance of a device and the ease of manufacture of such device, and the higher cost of better-performing products has been accepted as an immutable law of nature. Photonic modules present an example of the trade-off between performance and manufacturability.

Current photonic modules are hybrid assemblies containing various optical, mechanical, and electronic parts. In many instances, the assembly considerations and the operational considerations for a given component may be incompatible with each other, and further, the assembly and operational considerations for one component may be incompatible with those for another. The substrate of a hybrid photonic assembly is a particular example of such competing considerations.

For example, in many instances soldering is the preferred bonding technique, and electrical resist soldering is one practical technique. In electrical resist soldering, a resistor pad is formed on the substrate at or near the bond site, and current is delivered to the resistor to provide the necessary heating. This militates toward a substrate with a low thermal conductivity so that the heat generated in the resistor stays localized to achieve required temperature. At the same time, the substrate is often required to provide heat dissipation and thermal equalization, which militates towards a substrate with a high thermal conductivity. In addition, the soldering of a fiber is carried out close to an optical coating on the front facet of the laser device, which can be damaged by excessive heat. Further complicating this in the case of a modulated laser, for example, is the fact that the substrate needs to provide for transmission lines that deliver RF signals to components attached to this substrate.

Previous approaches to the problem included cutting the substrate to provide a heat-blocking slot between the laser and the fiber solder site nearest the laser, or mounting the laser on a separate substrate. Forming a slot in the substrate, while effective to block heat from the laser, can lead to mechanical instabilities in the module. Mounting the laser on a separate substrate complicates the assembly fabrication and is also subject to mechanical instabilities.

SUMMARY OF THE INVENTION

The present invention provides a substrate structure that facilitates the fabrication of modules without sacrificing desirable operational characteristics. The invention finds applicability to a wide range of applications, with photonics modules being a particular example.

In brief, a substrate structure of the present invention comprises a high-thermal-conductivity substrate body with a low-thermal-conductivity dielectric layer overlying at least a portion of the substrate body. In this context, the term “high thermal conductivity” will be taken to mean a thermal conductivity greater than 20 W/m°K (watts per meter per degree Kelvin) while the term “low thermal conductivity” will be taken to mean a thermal conductivity less than 5 W/m°K.

In some embodiments, patterned metal layers for electrical circuit connections can be located on the dielectric layer, on the substrate body (under the dielectric layer, on regions of exposed substrate body, or both), or on both the dielectric layer and the substrate body. In embodiments where the laser is driven at high frequencies (e.g., 2.5 Gbits/sec), the dielectric layer material and thickness can be chosen to provide desired RF behavior. For example, the electrodes and dielectric layer can be configured to provide a transmission line with the desired impedance.

In embodiments where it is desired to solder a component to the substrate, a heater resistor can be formed on the dielectric layer, thereby facilitating soldering the component.

In specific embodiments, the dielectric layer, any metal layers, and any heater resistors are fabricated by thick-film technology where the layer material is deposited in a thick liquid or paste form (like paint), and hardened, typically by heating.

A further understanding of the nature and advantages of the present invention may be realized by reference to the remaining portions of the specification and the drawings.

DESCRIPTION OF SPECIFIC EMBODIMENTS

Figure 1:
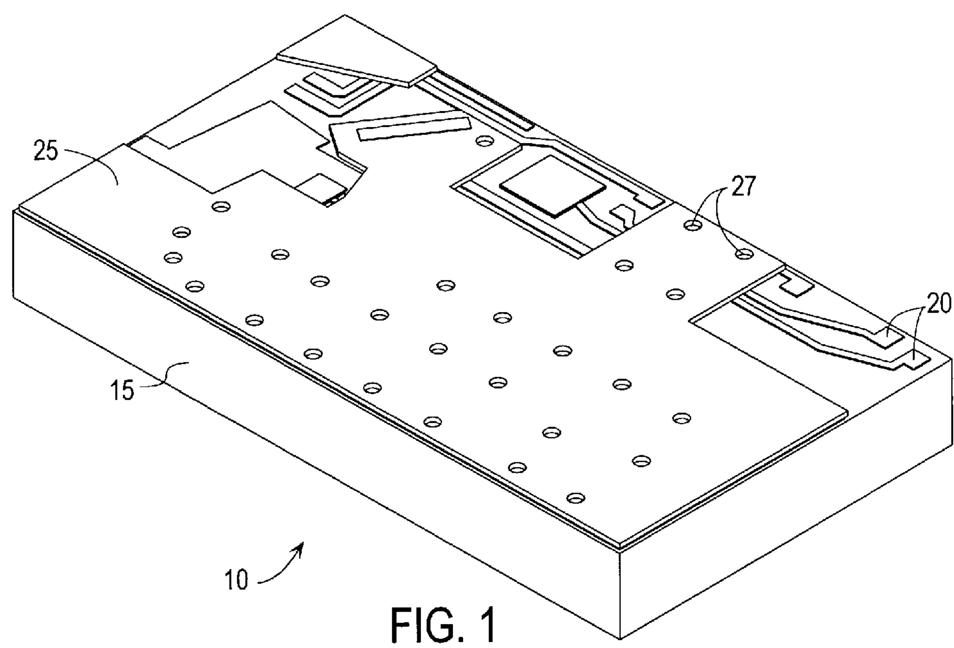
FIG. 1 is a perspective view of a substrate structure in an embodiment of the present invention.

FIG. 1 is a perspective view of a substrate structure 10 (sometimes referred to as substrate 10) in an embodiment of the present invention. Substrate 10 is a composite structure that includes a substrate body 15 (sometimes referred to as body 15) of material having a high thermal conductivity such as beryllium oxide, aluminum nitride, or aluminum oxide (listed in descending order of thermal conductivity). In a particular implementation, body 15 is formed of aluminum nitride. It should be understood that a reference to a material such as aluminum nitride contemplates the possible presence of other materials in small or trace amounts.

In a specific implementation, substrate 10 has a number of patterned layers deposited on body 15, including a first metal layer 20 and a dielectric layer 25 of material having a low thermal conductivity. As part of the patterning for a particular application, dielectric layer 25 is formed with a number of via holes 27. An extended portion of first metal layer 20 serves as a ground plane while other portions provide routing traces for connection to electrical components on the substrate structure.

Figure 2:
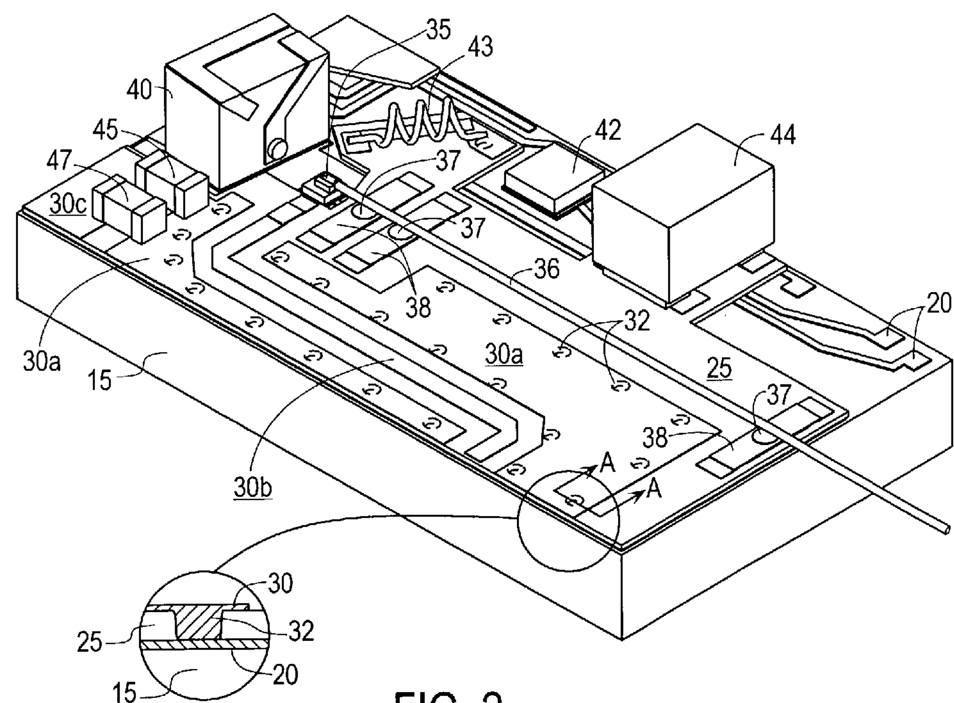
FIG. 2 is a perspective view of the substrate structure with an additional top metal layer and mounted components, and further including a fragmentary cross-sectional view along line A—A.

FIG. 2 is a perspective view of substrate structure 10 for a particular application that requires a patterned second metal layer 30. Also shown are additional mounted optical, electrical, and optoelectronic elements that provide the functionality for the particular application, which is an external cavity laser diode (ECLD). The figure also includes a fragmentary cross-sectional view of substrate structure 10 along line A—A. The patterned layers are deposited using known thick-film processing techniques. The metal layers are preferably gold, but other metals could be used. The dielectric layer is preferably a glass, ceramic, or glass/ceramic material available from vendors such as DuPont Microcircuit Materials. The use of thick film processing techniques is not necessary to the invention; thin film techniques could also be used, but tend to be more expensive.

Dielectric layer 25 covers a significant portion of the substrate area, and second metal layer 30 is patterned on top to include a first set of one or more segments 30*a*, a second segment 30*b*, and a third set of one or more segments 30*c*. Metal vias 32 are formed in via holes 27, connecting segments 30*a* to the ground layer portion of first metal layer 20. This is typically an additional operation to depositing second metal layer 30, although the latter would establish a measure of electrical contact. Vias 32 are shown in phantom since they are not visible from the top of second metal layer segments 30*a*. Segment 30*b* provides an RF transmission line for driving a laser diode 35 that is mounted to the substrate structure, while segments 30*c* provide bond pads for electrical components on the substrate structure.

Dimensions are generally not part of the invention, but it is noted that the substrate body is a few to several millimeters on a side (e.g., 7×12 mm) and has a thickness in the 0.5–2 mm range. The metal layer thicknesses are typically in the 0.01–0.03 mm range and the dielectric layer thickness can be on the order of 0.1 mm.

An optical fiber 36 is soldered or otherwise fastened to bond pads 37 located on respective heater resistors 38 that are used for electrical resist soldering. Other elements on the substrate include a monitor photodiode 40, a thermistor 42, inductors 43 and 44, and capacitors 45 and 47. These elements are standard and will not be described further except to note that the thermistor is used for monitoring the temperature on the substrate.

Figure 3:
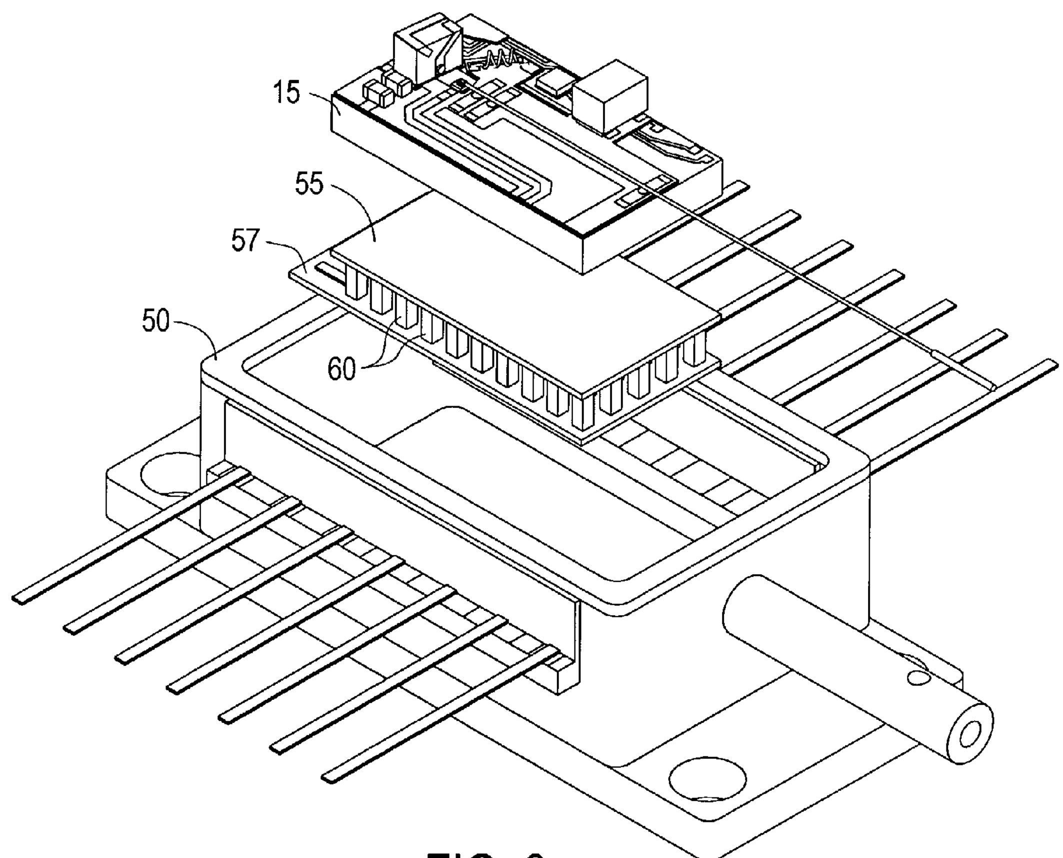
FIG. 3 is a perspective exploded view of the substrate structure of FIG. 2 being incorporated into a packaged external cavity laser diode (ECLD) module.
Figure 4:
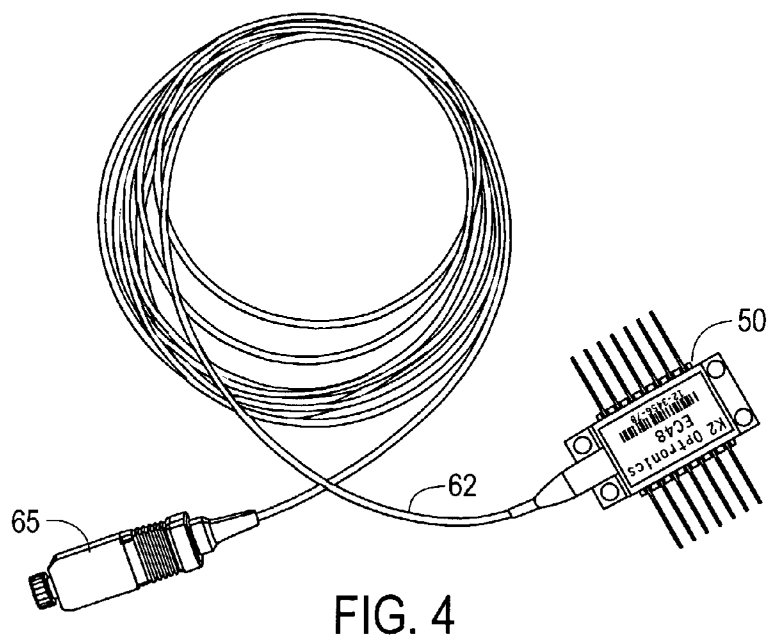
FIG. 4 shows a packaged ECLD module incorporating the substrate structure and components of FIGS. 2 and 3.

FIG. 3 is an exploded view of an ECLD module, showing additional elements that are included in a representative hermetically sealed package 50 (a 14-pin butterfly package for a specific implementation). Specifically, substrate 10 with the ECLD elements mounted thereon is in intimate thermal contact with a thermoelectric cooler (TEC), which is formed of upper and lower metal electrodes 55 and 57, between which are disposed a plurality of thermoelectric cooling elements 60. Elements 60 provide a plurality of bi-material junctions. FIG. 4 shows the ECLD module in its packaged form. In accordance with known practice, the device may be configured with a fiber pigtail 62 that terminates in a desired type of fiber connector 65.

In conclusion it can be seen that the substrate structure of the present invention, with its low-thermal-conductivity dielectric layer 15 overlying the high-thermal-conductivity substrate body 15 provides a versatile and effective platform for broadband and photonics devices. The dielectric layer serves as a substrate to carry transmission line and conducting traces to electronic and electro-optical components, which can be mounted with good thermal contact with the high thermal conductivity substrate body below. Additionally, the dielectric layer provides a thermal barrier for heating resistors 38, which are used for attachment (for example via soldering) of fiber 40, and possibly other components.

While the above is a complete description of specific embodiments of the invention, various modifications, alternative constructions, and equivalents may be used. For example, while a substrate for a laser diode is described, embodiments of the invention can be used to isolate the heat in connection with active alignment of other active optoelectronic components such as distributed feedback (DFB) lasers, electro-acoustic modulators (EAMs), light-emitting diodes (LEDs), SOAs, and the like. Moreover, substrate embodiments can be used in connection with the assembly of microelectronic components that are assembled by soldering where it is desired or necessary to isolate the soldering area to localize the heat for solder reflow without overheating other components. This is true, even if a laser beam rather than resist soldering is used as the heat source.

Therefore, the above description should not be taken as limiting the scope of the invention as defined by the claims.

What is claimed is:

1. An optoelectronic component substrate structure comprising:

a body formed of a substantially electrically non-conducting material having a high thermal conductivity, said body being substantially devoid of heat barrier slots;

a dielectric layer overlying at least a portion of said body, said dielectric layer being formed of a material having a low thermal conductivity; and a metal layer formed on said dielectric layer, said metal layer comprising:

a first portion defining a central conductor of a transmission line;

a second portion spaced from said central conductor on one side of said central conductor to define a first flanking conductor; and a third portion spaced from said central conductor on another side of said central conductor to define a second flanking conductor;

said first and second flanking conductors being electrically connected to a common ground.

2. The substrate structure of claim 1, and further comprising:

a ground conductor formed over at least a portion of said body; and a signal trace conductor formed on said dielectric layer, said signal trace conductor insulated from said ground conductor.

3. The substrate structure of claim 2 wherein at least a portion of said ground conductor is formed on said body with at least a portion formed between said body and said dielectric layer.

4. The substrate structure of claim 2 wherein at least a portion of said ground conductor is formed on said dielectric layer and is laterally spaced from said signal trace conductor.

5. The substrate structure of claim 2 wherein said dielectric layer, said ground conductor, and said signal trace are fabricated using thick-film technology.

6. The substrate structure of claim 1, and further comprising a metal layer formed on said body, said metal layer comprising:

a first portion between said body and said dielectric layer; and a second portion on a region of said body having no dielectric layer.

7. The substrate structure of claim 1 wherein said body's material has a thermal conductivity greater than 100 W/m°K.

8. The substrate structure of claim 1 wherein said dielectric layer's material has a thermal conductivity less than 3 W/m°K.

9. The substrate structure of claim 1 wherein said dielectric layer's material has a thermal conductivity that is at least a factor of 10 less than a thermal conductivity that characterizes said body's material.

10. The substrate structure of claim 1 wherein:

said dielectric layer's material comprises a major portion of silica; and said body's material comprises a major portion of aluminum nitride.

11. A substrate structure comprising:

a body formed of a material characterized by a thermal conductivity;

a first metal layer formed on said body, said first metal layer being patterned so that at least a first portion of said first metal layer defines a ground plane;

a dielectric layer formed on said first metal layer, said dielectric layer being patterned so that at least a first portion of said dielectric layer overlies said ground plane, said dielectric layer being formed of a material having a thermal conductivity that is at least a factor of 10 less than said body's thermal conductivity; and a second metal layer formed on said dielectric layer, said second metal layer being patterned so as to define at least first and second portions, wherein said first portion of said second metal layer defines a signal trace and said second portion of said second metal layer is electrically connected to said ground plane.

12. The substrate structure of claim 11 wherein a second portion of said first metal layer defines at least one signal trace.

13. The substrate structure of claim 11 wherein said body's material has a thermal conductivity greater than 100 W/m°K.

14. The substrate structure of claim 11 wherein said dielectric layer's material has a thermal conductivity less than 3 W/m°K.

15. A substrate structure comprising:

a body formed of a material having a high thermal conductivity, said body being substantially devoid of heat barrier slots;

a first metal layer formed on said body;

a dielectric layer overlying at least a portion of said body and overlying at least a portion of said first metal layer, said dielectric layer being formed of a material having a low thermal conductivity;

a second metal layer overlying at least a portion of said dielectric layer; and a heater resistor formed on said dielectric layer so that said dielectric layer provides thermal isolation between said heater resistor and said body;

wherein said dielectric layer is formed with a via hole, said first metal layer has a portion designated a ground plane, and said second metal layer is patterned with spatially disjoint first and second segments with said first segment overlying said via hole so as to make electrical contact with said ground plane while said second segment is insulated from said first segment and said ground plane by said dielectric layer.

16. The substrate structure of claim 15 wherein said body's material has a thermal conductivity greater than 100 W/m°K.

17. The substrate structure of claim 15 wherein said dielectric layer's material has a thermal conductivity less than 3 W/m°K.

18. The substrate structure of claim 15 wherein:

said dielectric layer's material comprises a major portion of silica; and said body's material comprises a major portion of aluminum nitride.

19. The substrate structure of claim 15 wherein said dielectric layer's thermal conductivity is at least a factor of 10 less than said body's thermal conductivity.

20. The substrate structure of claim 15 wherein said first metal layer is patterned to include, in addition to said ground plane, an additional portion that defines at least one signal trace.

21. A module comprising the substrate structure of claim 15, the module further comprising:

an optoelectronic component mounted to the substrate structure; and an optical fiber soldered to a bond site disposed on said heater resistor.

22. The module of claim 21 wherein said optoelectronic component is a laser diode.

23. The module of claim 21 wherein:

said second segment of said second metal layer is electrically connected to said optoelectronic component;

said second segment of said second metal layer, said ground plane, and said dielectric layer define, at least in part, an RF transmission line.

24. A module comprising the substrate structure of claim 1, the module further comprising:

an optoelectronic component mounted to the substrate structure; and an optical fiber soldered to a bond site disposed on said dielectric layer to provide thermal insulation during soldering of said optical fiber to said bond site.

25. The module of claim 24 wherein said optoelectronic component is a laser diode.

26. A module comprising the substrate structure of claim 11, the module further comprising:

an optoelectronic component mounted to the substrate structure; and an optical fiber soldered to a bond site disposed on said dielectric layer to provide thermal insulation during soldering of said optical fiber to said bond site.

27. The module of claim 26 wherein said optoelectronic component is a laser diode.

28. A substrate structure comprising:

a body formed of a material characterized by a thermal conductivity;

a first metal layer formed on said body, said first metal layer being patterned so that a first portion of said first metal layer defines a ground plane and a second portion of said first metal layer defines at least one signal trace;

a dielectric layer formed on said first metal layer, said dielectric layer being patterned so that at least a first portion of said dielectric layer overlies said ground plane, said dielectric layer being formed of a material having a thermal conductivity that is at least a factor of 10 less than said body's thermal conductivity; and a second metal layer formed on said dielectric layer, said second metal layer being patterned so that a first portion of said second metal layer defines a signal trace and a second portion of said second metal layer is electrically connected to said ground plane.

29. The substrate structure of claim 28 wherein said body's material comprises a major portion of aluminum nitride.

30. A module comprising the substrate structure of claim 28, the module further comprising:

an optoelectronic component mounted to the substrate structure; and an optical fiber soldered to a bond site disposed on said dielectric layer to provide thermal insulation during soldering of said optical fiber to said bond site.

31. The module of claim 30 wherein said optoelectronic component is a laser diode.

32. The module of claim 30 wherein said bond site is provided by a bond pad on a heating resistor, said heating resistor being entirely disposed on said dielectric layer.

33. A module comprising:

a substrate structure that includes a body formed of a material having a high thermal conductivity, a first metal layer formed on said body, said first metal layer having a portion designated a ground plane, a dielectric layer overlying at least a portion of said body and overlying at least a portion of said first metal layer, said dielectric layer being formed of a material having a low thermal conductivity, a second metal layer overlying at least a portion of said dielectric layer, said second metal layer being patterned with spatially disjoint first and second segments with said first segment making electrical contact with said ground plane while said second segment is insulated from said first segment and said ground plane by said dielectric layer, and a heater resistor formed on said dielectric layer so that said dielectric layer provides thermal isolation between said heater resistor and said body;

an optoelectronic component mounted to the substrate structure with said second segment of said second metal layer being electrically connected to said optoelectronic component, said second segment of said second metal layer, said ground plane, and said dielectric layer defining, at least in part, an RF transmission line for providing signals to said optoelectronic component; and an optical fiber soldered to a bond site disposed on said heater resistor.

34. The module of claim 33 wherein said first segment of said second metal layer makes electrical contact with said ground plane through at least one metal via passing through a via hole in said dielectric layer.

35. The module of claim 33 wherein said body's material has a thermal conductivity greater than 100 W/m°K.

36. The module of claim 35 wherein said body's material comprises a major portion of aluminum nitride.

37. The module of claim 24 wherein said bond site is provided by a bond pad on a heating resistor, said heating resistor being entirely disposed on said dielectric layer.

* * * * *